United States Patent
Yonemura et al.

(10) Patent No.: US 7,709,939 B2
(45) Date of Patent: May 4, 2010

(54) METAL-BASE CIRCUIT BOARD AND ITS MANUFACTURING METHOD

(75) Inventors: Naomi Yonemura, Shibukawa (JP);
Katsunori Yashima, Shibukawa (JP);
Yoshihiko Tsujimura, Shibukawa (JP);
Hidenori Ishikura, Shibukawa (JP);
Takashi Saiki, Shibukawa (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 693 days.

(21) Appl. No.: 10/553,076

(22) PCT Filed: Apr. 15, 2004

(86) PCT No.: PCT/JP2004/005365

§ 371 (c)(1),
(2), (4) Date: Oct. 12, 2005

(87) PCT Pub. No.: WO2004/093186

PCT Pub. Date: Oct. 28, 2004

(65) Prior Publication Data

US 2007/0128772 A1 Jun. 7, 2007

(30) Foreign Application Priority Data

| Apr. 15, 2003 | (JP) | ............... 2003-110377 |
| Jul. 17, 2003 | (JP) | ............... 2003-275979 |
| Sep. 18, 2003 | (JP) | ............... 2003-326256 |
| Feb. 19, 2004 | (JP) | ............... 2004-042993 |
| Mar. 1, 2004  | (JP) | ............... 2004-055890 |

(51) Int. Cl.
*H01L 23/02* (2006.01)

(52) U.S. Cl. .............. 257/678; 361/748; 361/750; 361/761; 361/764; 361/783; 174/250; 174/251; 174/256; 174/257; 174/258; 174/260; 174/268

(58) Field of Classification Search ................. 361/748, 361/750, 761, 764, 783; 257/787, E21.504, 257/E23.004, E23.036, E23.066, E23.092, 257/678; 174/250, 251, 258, 256, 257, 260, 174/268

See application file for complete search history.

(56) References Cited

U.S. PATENT DOCUMENTS

| 5,661,343 A   | * | 8/1997 | Takahashi et al. ............ 257/723 |
| 6,233,817 B1  | * | 5/2001 | Ellis et al. ...................... 29/832 |
| 6,235,862 B1  | * | 5/2001 | Isshiki et al. ................... 528/15 |
| 2002/0030268 A1 | * | 3/2002 | Sakamoto et al. ........... 257/700 |
| 2005/0145595 A1 | * | 7/2005 | Cubero Pitel ................ 216/13 |

FOREIGN PATENT DOCUMENTS

| JP | 60-262636  | 12/1985 |
| JP | 3-69185    | 3/1991  |
| JP | 9-326536   | 12/1997 |
| JP | 2000-151050 | 5/2000 |
| JP | 2003-46211 | 2/2003 |
| JP | 2003-229508 | 8/2003 |

* cited by examiner

*Primary Examiner*—Lynne A. Gurley
*Assistant Examiner*—Meiya Li
(74) *Attorney, Agent, or Firm*—Oblon, Spivak, McClelland, Maier & Neustadt, L.L.P.

(57) ABSTRACT

A metal base circuit board to be used for a hybrid integrated circuit, including circuits provided on a metal plate via an insulating layer, a power semiconductor mounted on the circuit, and a control semiconductor to control the power semiconductor, provided on the circuit. A low capacitance portion is embedded under a circuit portion on which the control semiconductor is mounted, preferably. The low capacitance portion is made of a resin containing an inorganic filler and has a dielectric constant of from 2 to 9.

4 Claims, 10 Drawing Sheets

Fig. 1-5
(1)
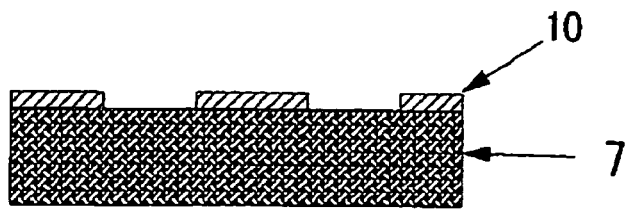
(2)
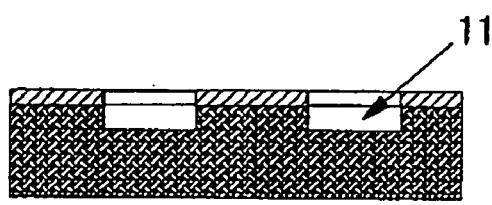
(3)
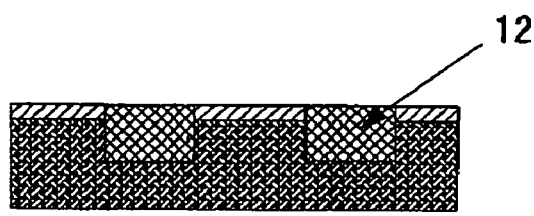
(4)
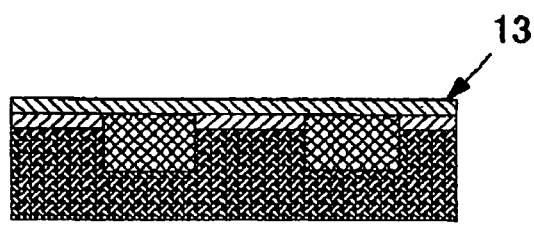
(5)
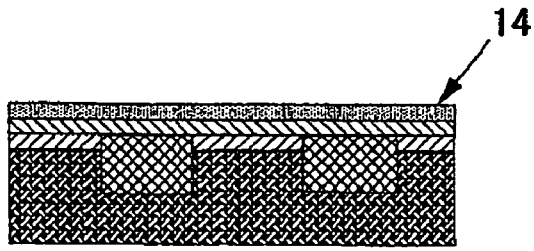
(6)
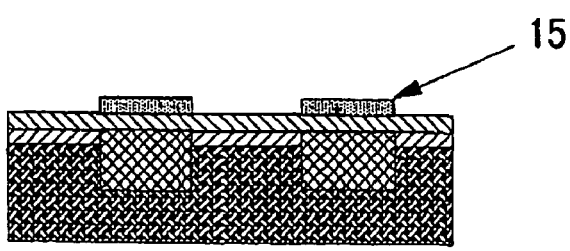

Fig. 2-1
(a) 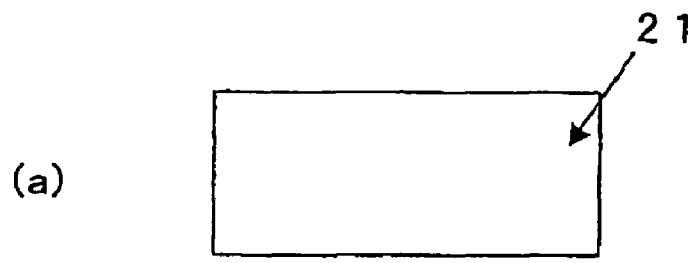
(b) 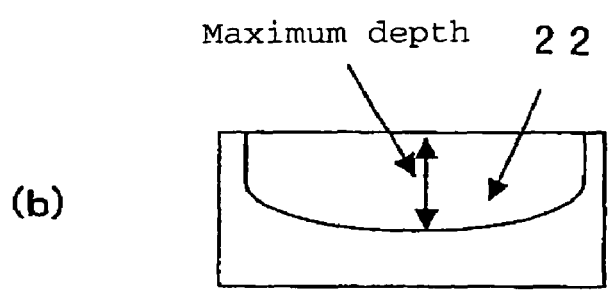
(c) 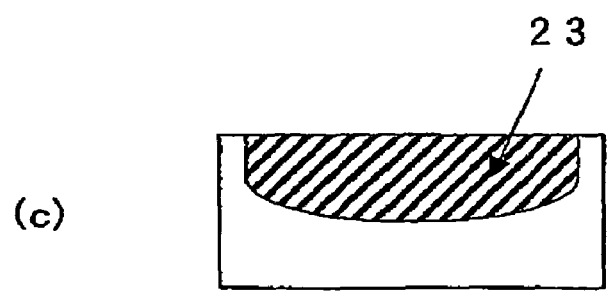
(d) 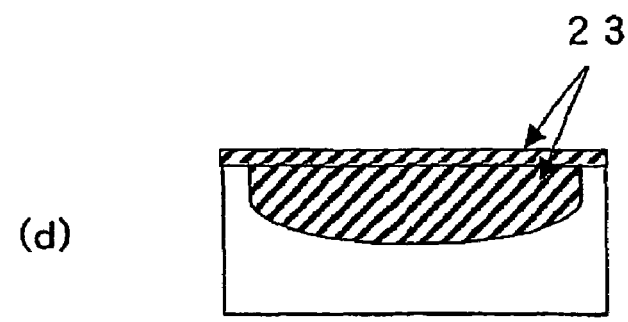

Fig. 2-1 (Continued)
(e) 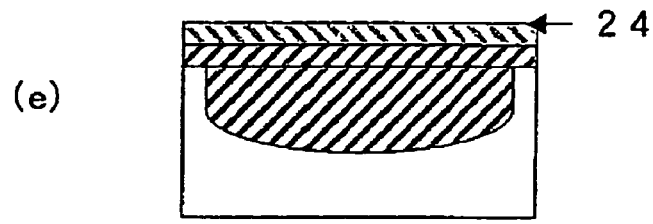
(f) 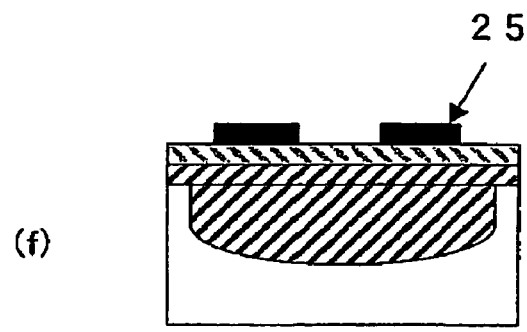
(g) 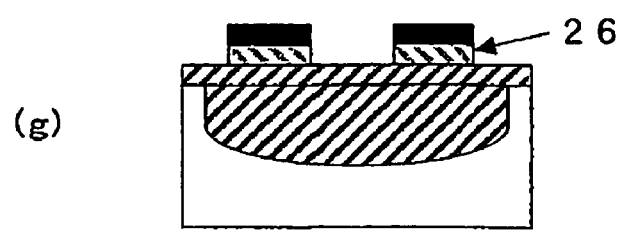
(h) 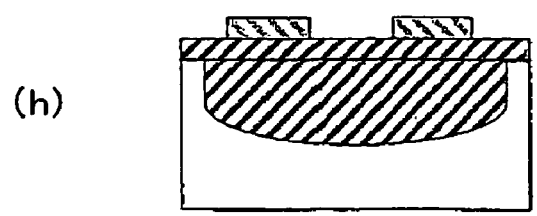

METAL-BASE CIRCUIT BOARD AND ITS MANUFACTURING METHOD

TECHNICAL FIELD

The present invention relates to a metal base circuit board suitable for high frequency operation and its production process. Particularly, the present invention relates to a metal base circuit board suitably used for a hybrid integrated circuit having both power semiconductor and control semiconductor mounted, and its production process.

BACKGROUND ART

A metal base circuit board comprising an insulating layer made of e.g. an epoxy resin containing an inorganic filler provided on a metal plate, and having a circuit provided thereon, is excellent in heat dissipation properties and is thereby used as a circuit board on which a highly heat generating electronic component is to be mounted.

FIG. 1-1 illustrates one example of a conventional hybrid integrated circuit comprising a metal base circuit board and a semiconductor device mounted thereon. In its structure, a power semiconductor 2 and a signal conditioning semiconductor (hereinafter sometimes referred to as a control semiconductor) 1 are mounted on circuits 3 made of e.g. copper via solder. Further, in its structure, the semiconductors are electrically connected via the copper circuit or via a bonding wire 5. When the power conductor 2 is mounted on the circuit 3, a heat sink 6 is interposed therebetween in many cases so as to accelerate heat dissipation and to prevent an increase in temperature of the power semiconductor which may lead to malfunction (Japanese Patent No. 3156798).

In the hybrid integrated circuit having the above structure, each of the semiconductors and a metal base board are electrically and electrostatically connected. Accordingly, when it is intended to increase the operating frequency (several hundred kHz or above), signals (digital signals) from the control semiconductor 1 are distorted, the power semiconductor 2 malfunctions, and the apparatus itself does not operate as designed in some cases. As a countermeasure against the above, lift-off may be employed so as to eliminate bad influences of the capacitance resulting from a metal board, but there are many problems in view of cost and assembling.

Further, FIG. 1-2 illustrates an example of another known hybrid integrated circuit. There has been an attempt to reduce bad influences of the capacitance resulting from a metal board by increasing the thickness of an insulating layer on which a control semiconductor is mounted as compared with the structure shown in FIG. 1-1. However, in preparation of such a hybrid integrated circuit or a metal base circuit board to be used therefor, it is required to prepare insulating layer portions with different thicknesses partially, which makes the process complicated, and which enlarges the obtained hybrid integrated circuit in an upward direction. Further, there has been an attempt to achieve the above structure by laminating a resin substrate or the like having a circuit preliminarily provided thereon on a metal plate or on a metal plate having an insulating layer provided thereon (also called a metal base board) instead of the increase in thickness of the insulating layer (Japanese Patent No. 2608980), however, the above problem still remained unsolved.

With respect to a circuit board on which a hybrid integrated circuit is mounted, along with high integration of a semiconductor device, a means becomes in the mainstream that a power semiconductor device, etc. is miniaturized and further, a resistor chip, etc. in addition to various types of semiconductor devices, is mounted on the same board. As board characteristics required are different among the respective semiconductor devices and electronic components, a circuit board having characteristics partially corresponding to the respective semiconductor devices and electronic components has been required.

Accordingly, a circuit board comprising different types of insulating layers combined has been proposed, as disclosed in JP-A-6-90071, for example. However, it costs a lot to produce such a composite insulating board since a process of its production is complicated, and further, it is not technically easy to complicatedly combine different types of insulating layers in a small area, whereby considerable miniaturization of a circuit board has been hardly achieved.

Further, in a hybrid integrated circuit employing a metal base circuit board, usually, both power semiconductor and control semiconductor to control operation of the power semiconductor are mounted on circuits of the metal base circuit board. As characteristics required for the metal base circuit board, the former is required to be excellent in thermal conductivity even if it has a slightly high capacitance, and the latter is required to have a very low capacitance even at the sacrifice of the thermal conductivity.

However, it was found that if a control semiconductor is mounted on a circuit which is designed to have a very low capacitance, concurrent heat dissipation from the control semiconductor is insufficient, and no sufficient operating time can be secured in some cases.

DISCLOSURE OF THE INVENTION

Under these circumstances, the present invention has been made to solve the above problems of conventional technology. It is an object of the present invention to provide a metal base circuit board which remarkably reduces malfunction time of a semiconductor which occurs when a hybrid integrated circuit is operated at a high frequency, and which is excellent in heat dissipation properties, at a low cost.

Further, it is an object of the present invention to provide a metal base circuit board which is designed that circuit board characteristics can be partially changed and accordingly on which various types of semiconductor devices, electronic components, electric components, etc. can further be mounted on the same circuit board.

Namely, the present inventors have conducted to solve the above problems and as a result, found that a hybrid integrated circuit with which heat from a control semiconductor can be sufficiently dissipated by providing a low dielectric constant portion at least under a circuit portion electrically connected directly to the control semiconductor, which is excellent in noise characteristics and which can sufficiently cope with high frequency operation can be obtained. The present invention has been accomplished on the basis of this discovery.

Namely, the present invention provides the following.

1-1. A metal base circuit board to be use for a hybrid integrated circuit, comprising circuits provided on a metal plate via an insulating layer (A, B), a power semiconductor mounted on the circuit and a control semiconductor to control the power semiconductor, provided on the circuit, wherein a low capacitance portion is embedded under a circuit portion (pad portion) on which the control semiconductor is mounted.

1-2. The metal base circuit board according to the above 1-1, wherein the low capacitance portion is made of a resin containing an inorganic filler and has a dielectric constant of from 2 to 9.

1-3. The metal base circuit board according to the above 1-1 or 1-2, wherein the thickness of the low capacitance portion is from 100 to 1,000 μm.

1-4. The metal base circuit board according to the above 1-1, 1-2 or 1-3, wherein the circuit portion (pad portion) on which the control semiconductor is mounted is provided on the low capacitance portion embedded in the metal plate via the insulating layer (B).

1-5. A process for producing a metal base circuit board, which comprises (1) a step of filling concaves of a metal plate having concave portions on one principal plane, with a substance to form a low capacitance portion to the same level of height as the surface of an insulating layer (A), to form a plate provided with a low capacitance member, (2) a step of providing an insulating layer (B) made of a resin containing an inorganic filler on the surface of the low capacitance portion and the insulating layer (A) of the plate provided with a low capacitance member to form a board provided with a low capacitance member, (3) a step of providing a metal foil on the surface of the insulating layer (B) of the board provided with a low capacitance member to form a metal assembly, and (4) a step of processing the metal foil of the metal assembly to form circuits, including forming a circuit portion (pad portion) on which a control semiconductor is to be mounted from the metal foil located at least at the surface of the low capacitance portion.

1-6. The process for producing a metal base circuit board according to the above 1-5, wherein the metal plate having concave portions on one principal plane is prepared by (a) a step of providing the insulating layer (A) made of a resin containing an inorganic filler on a desired position of the principal plane of the metal plate, and (b) a step of etching the metal plate employing the insulating layer (A) as a mask to form the concave portions on the surface of the metal plate.

2-1. A metal base circuit board comprising circuits provided on a metal plate via an insulating layer, wherein a dent portion is provided on one side of the metal plate in such a state that the circumferential portion thereof is not opened, and insulating layers made of the same material are provided both on the space of the dent portion and on the metal plate on which the dent portion is present.

2-2. The metal base circuit board according to the above 2-1, wherein the maximum depth of the dent portion is from 10 to 50% of the thickness of the metal plate, the size of the dent portion as viewed from the vertical direction is at least 50% of the area of the metal plate, and in a shape of the dent portion as viewed from the vertical direction, the corner has a curvature radius of at least 2.5 mm.

2-3. The metal base circuit board according to the above 2-1 or 2-2, wherein the insulating layers are made of a resin containing an inorganic filler, and the resin composition after cured has a storage elastic modulus of at most 15,000 MPa at 300 K.

3-1. A metal base circuit board to be used for a hybrid integrated circuit, comprising a metal plate, an insulating layer provided on the metal plate, circuits provided on the insulating layer and a plurality of semiconductors mounted on the circuits, wherein a low dielectric constant portion is provided on the metal plate under a part of the circuits on which no semiconductor is mounted.

3-2. The metal base circuit board according to the above 3-1, wherein the low dielectric constant portion is formed by providing a dent portion on the surface of the metal plate and filling the dent portion with a resin containing an inorganic filler.

3-3. The metal base circuit board according to the above 3-2, wherein the side wall of the dent portion has a gradient of from 35 to 65°.

3-4. The metal base circuit board according to the above 3-2 or 3-3, wherein the inorganic filler is made of fused silica (silicon dioxide), and the fused silica comprises from 3.5 to 45.0 vol % of particles having an average particle size of from 0.3 to 5.0 μm and from 18.0 to 80.0 vol % of particles having an average particle size of from 6 to 30 μm.

4-1. A metal base circuit board to be used for a hybrid integrated circuit, comprising a metal plate, an insulating layer provided on the metal plate, circuits provided on the insulating layer and a plurality of semiconductors mounted on the circuits, wherein dent portions are provided on the surface of the metal plate under a part of the circuits on which no semiconductor is mounted, the dent portions are filled with a resin containing an inorganic filler, and the corner portion of the dent portions as viewed from the vertical direction has a curvature radius of at least 0.4 mm.

4-2. The metal base circuit board according to the above 4-1, wherein the inorganic filler is made of fused silica (silicon dioxide), and the fused silica comprises from 3.5 to 45.0 vol % of particles having an average particle size of from 0.3 to 5.0 μm and from 18.0 to 80.0 vol % of particles having an average particle size of from 6 to 30 μm.

5-1. A process for producing a metal base circuit board to be used for a hybrid integrated circuit, comprising a metal plate, an insulating layer provided on the metal plate, circuits provided on the insulating layer, a power semiconductor mounted on the circuit and a control semiconductor to control the power semiconductor, provided on the circuit, which comprises (1) a step of forming concave portions on the principal plane at the side where the insulating layer is provided on the metal plate, (2) a step of applying an insulating adhesive to the concave portions and the metal plate at a portion other than the concave portions to the same level of height, (3) a step of providing a metal foil on the surface of the insulating adhesive and curing the insulating adhesive to form a metal assembly, and (4) a step of processing the metal foil of the metal assembly to form circuits.

5-2. A metal base circuit board obtained by the process for producing a metal base circuit board as defined in the above 5-1, wherein the insulating adhesive is made of a resin containing an inorganic filler and has a coefficient of thermal conductivity after cured of at least 1.3 W/mK.

5-3. The metal base circuit board according to the above 5-2, wherein the capacitance per unit area between the metal plate and the circuit on the concave portion filled with the insulating adhesive is at most 50 pF/cm$^2$, and the capacitance per unit area between the metal plate and the circuit at a portion other than the above is at least 50 pF/cm$^2$ and at most 160 pF/cm$^2$.

EFFECTS OF THE INVENTION

1. In the metal base circuit board of the present invention, a low capacitance portion is embedded under a circuit portion on which a control semiconductor is mounted and under a circuit to which high frequency signals are transmitted, so as to reduce distortion of signals from the control semiconductor to a power semiconductor. Further, the low capacitance portion which is generally poor in heat dissipation properties is not formed and only an insulating layer excellent in heat dissipation properties is present under a circuit portion on which the power semiconductor is mounted. Accordingly, by using such a metal base circuit board, a hybrid integrated circuit which hardly malfunctions even in high frequency operation can easily be obtained.

2. The metal base circuit board of the present invention having the above structure is characterized in that characteristics of the circuit board can be partially changed and various types of semiconductor device, etc. can be mounted on the same circuit board, and it can be suitably used for a hybrid integrated circuit having both power semiconductor and control semiconductor, for example. Further, in the circuit board, a heat generating electronic component and a high frequency generating apparatus can be properly disposed at desired portions. Accordingly, problems of the conventional technology can be solved, such that an insulating layer which can absorb a stress is to be designed thick so as to achieve low stress properties, but the heat resistance becomes large as the trade-off. Resultingly, such effects can also be obtained that heat cycle resistance of a mounted electronic component such as a chip resistor improves.

3. The metal base circuit board of the present invention is a metal base circuit board to be used for a hybrid integrated circuit having a plurality of semiconductors including a control semiconductor generating a large amount of heat. By the above structure, that is, by making a low dielectric constant portion be present under a circuit which is directly connected to the control semiconductor, heat generated by the control semiconductor is immediately dissipated to a metal plate through the circuit and the insulating layer, while the operating characteristics of the control semiconductor are maintained. Accordingly, the metal base circuit board can be applied to a hybrid integrated circuit for e.g. a high frequency filter such as a macro-strip-line, a high frequency electric source and an audio digital amplifier, to which a conventional metal base circuit board can not be applied, and industrially new applications will be broadened.

Further, the metal base circuit board of the present invention has the above structure and in addition, has such a structure that the low dielectric constant portion has a specific shape, and specific fused silica (silicon dioxide) is used as an inorganic filler, whereby the metal base circuit board of the present invention has more excellent dielectric characteristics, a semiconductor device can be operated with high reliability, and accordingly operational reliability of the hybrid integrated circuit can be increased.

4. Further, it employs such a structure that when a dent portion is viewed from the upward direction, a corner portion has a curvature radius (roundness) of at least 0.4 mm, whereby concentration of a stress in the low dielectric constant portion can be avoided, the adhesive force between the low dielectric constant portion and a metal plate or an insulating layer can be increased, and heat dissipation is more accelerated.

5. According to the production process of the present invention, a metal base circuit board having both portion which has a low capacitance and on which a control semiconductor is suitably mounted, and portion which has a slightly high capacitance but is excellent in thermal conductivity, and on which a power semiconductor is suitably mounted, can be obtained with a high yield. Accordingly, a metal base circuit board to be used for a hybrid integrated circuit, comprising a metal plate, an insulating layer provided on the metal plate, a circuit provided on the insulating layer, a power semiconductor mounted on the circuit and a control semiconductor to control the power semiconductor, provided on the circuit, can be provided at a low cost.

The metal base circuit board of the present invention employs an insulating adhesive having a coefficient of thermal conductivity after cured of at least 1.3 W/mK, whereby excellent heat dissipation properties are secured, a semiconductor device can be operated with high reliability, and accordingly operational reliability of a hybrid integrated circuit can be increased.

Further, the metal base circuit board of the present invention has both portion having a capacitance per unit area of at most 50 pF/cm$^2$ and portion of at least 50 pF/cm$^2$ and at most 160 pF/cm$^2$, whereby reliability of a hybrid integrated circuit can be more increased by selectively mounting a control semiconductor on the former portion.

BRIEF DESCRIPTION OF THE DRAWINGS

FIG. 1-2 illustrates another example of a hybrid integrated circuit employing a conventional metal base circuit board.

FIG. 1-3 illustrates one example of a hybrid integrated circuit employing a metal base circuit board of the present invention.

FIG. 1-4 illustrates one example of a hybrid integrated circuit employing another metal base circuit board of the present invention.

FIG. 1-5 illustrates one example of a process for producing a metal base circuit board of the present invention.

FIG. 2-1 illustrates one example of a metal base circuit board and its production process of the present invention.

FIG. 2-2 is a drawing illustrating "as viewed from the vertical direction" in the present invention.

FIG. 2-3 is a cross-sectional view illustrating a metal base circuit board of Comparative Example 1.

FIG. 2-4 is a cross-sectional view illustrating a metal base circuit board of Comparative Example 2.

FIG. 3-1 illustrates one example of a hybrid integrated circuit employing a metal base circuit board of the present invention.

FIG. 3-2 illustrates a dent portion provided on the hybrid integrated circuit shown in FIG. 3-1.

FIG. 3-3 is a plan view illustrating a dent portion provided on the hybrid integrated circuit shown in FIG. 3-1.

FIG. 4-1 is drawings illustrating a process for producing a metal base circuit board of the present invention.

FIG. 4-2 is a drawing illustrating one example of a hybrid integrated circuit employing a metal base circuit board of the present invention.

EXPLANATION OF SYMBOLS

1: Control semiconductor, 2: Power semiconductor, 3: Circuit, 4: Insulating layer (A), 5: Bonding wire, 6: Heat spreader, 7: Metal plate, 8: Insulating layer (B) or resin substrate, 9: Low capacitance portion, 10: Insulating layer (A), 11: Concave portion, 12: Low capacitance portion, 13: Insulating layer (B), 14: Metal foil, 15: Circuit (pad portion), 21: Metal plate, 22: Dent portion, 23: Insulating layer, 24: Metal foil, 25: Etching resist, 26: Circuit (metal foil), 31: Metal plate, 32: Insulating layer, 33: Low dielectric constant portion, 34: Bonding wire, 35: Circuit, 36: Heat spreader, 37: Power semiconductor, 38: Control semiconductor, 41: Metal plate, 42: Concave portion (space portion), 43: Insulating adhesive (insulating layer), 44: Metal foil, 45: Circuit, 46: Heat spreader, 47: Power semiconductor, 48: Control semiconductor, 49: Bonding wire

BEST MODE FOR CARRYING OUT THE INVENTION

Now, the present invention will be explained with reference to drawings.

Figure 1:
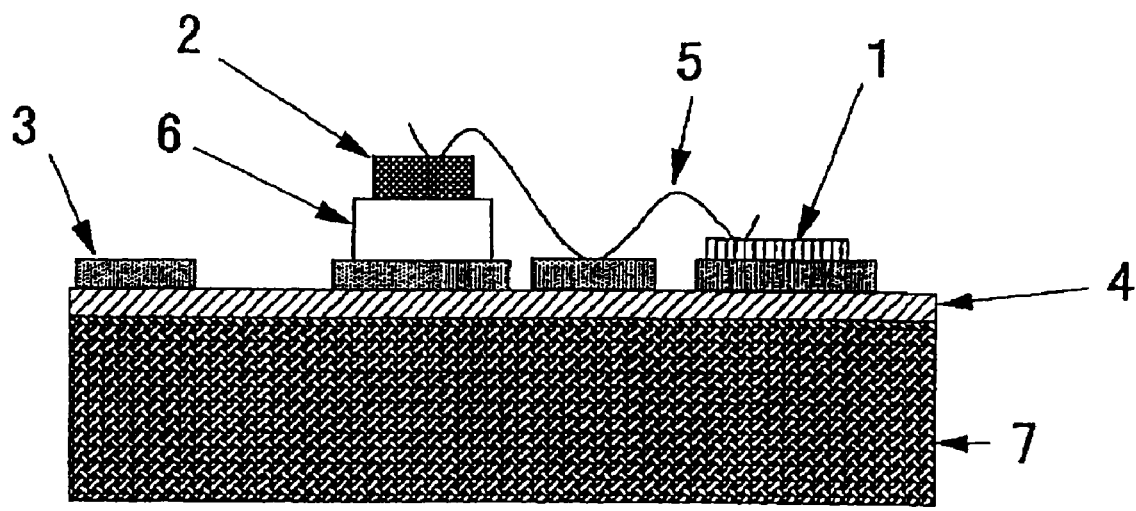
FIG. 1-1 illustrates one example of a hybrid integrated circuit employing a conventional metal base circuit board.
Figures 1, 2:
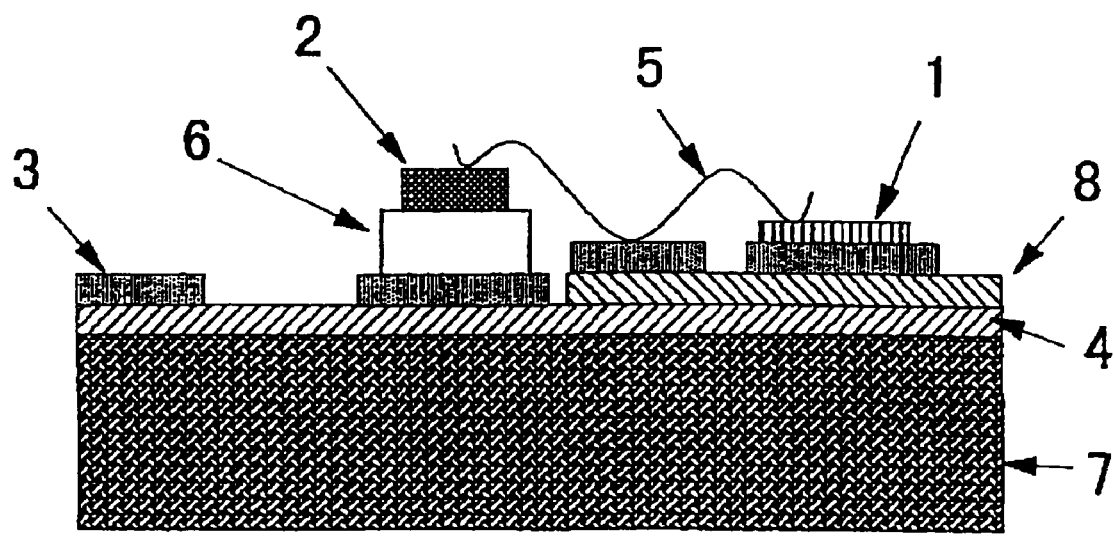
Figures 1, 2, 3:
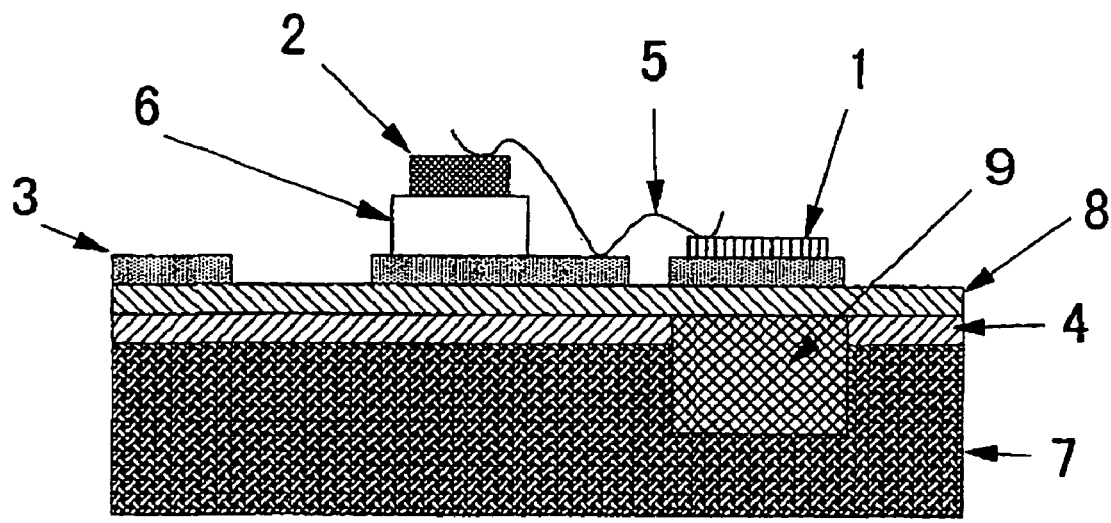

FIG. 1-3 is a drawing illustrating a hybrid integrated circuit employing a metal base circuit board of the present invention. The metal base circuit board of the present invention is a metal base circuit board to be used for a hybrid integrated circuit, comprising circuits provided on a metal plate via an insulating layer (A, B), a power semiconductor mounted on the circuit and a control semiconductor to control the power semiconductor, mounted on the circuit, characterized in that a low capacitance portion is embedded under a circuit portion (pad portion) on which the control semiconductor is mounted. Namely, the metal base circuit board of the present invention has, as shown in FIG. 1-3, such a structure that a low capacitance portion 9 is embedded under a circuit portion (also called a pad portion) on which a control semiconductor 1 is mounted and a circuit to which high frequency signals are transmitted, and the vicinity thereof, whereby the capacitance at the corresponding portion of the circuit board is decreased. Accordingly, distortion of signals from the control semiconductor 1 can be reduced, whereby malfunction of the power semiconductor and thus the hybrid integrated circuit can be decreased or prevented.

Further, FIG. 1-4 is a drawing illustrating a hybrid integrated circuit employing another metal base circuit board of the present invention. It has such a structure that a concave portion is formed on a desired portion on a metal plate 7, a low capacitance portion 9 is embedded in the concave portion, and a circuit is provided thereon via an insulating layer (A) 4 and an insulating layer (B) 8.

In the present invention, as a material of the low capacitance portion 9, a substance having a low dielectric constant is appropriately selected depending upon capacitance characteristics required for a hybrid integrated circuit, but a resin containing an inorganic powder, which is excellent in the adhesion with the adjacent metal plate or insulating layer, is preferred. According to studies by the present inventors, the dielectric constant of the resin containing an inorganic powder is preferably from 2 to 9, at which the object of the present invention is likely to be achieved. As the inorganic powder, alumina, boron nitride, magnesia, silica, silicon nitride, aluminum nitride or the like is preferably used. As the resin, an epoxy resin, a phenol resin, a polyimide resin, an engineering plastic or the like is preferably used. Further, one having a dielectric constant of from 2 to 9 can be obtained by selecting the types-of the inorganic powder and the resin and their blend ratio.

With respect to the shape of the low capacitance portion 9, the dimension is not limited so long as it is larger than the circuit on which a control semiconductor is mounted and the circuit to which high frequency signals are transmitted, but the thickness is required to be determined depending upon the operating frequency, the material of the low capacitance portion, etc. According to studies by the present inventors, when the thickness is at least 100 µm and at most 1,000 µm, a useful hybrid integrated circuit excellent in operating characteristics can be securely prepared. The thickness exceeding 1,000 µm is not technically problematic but increases the cost.

Further, in the metal base circuit board of the present invention, a portion under the circuit portion having no low capacitance portion and a portion under the power semiconductor are required to have high heat dissipation properties, and accordingly the insulating layer (A) is preferably formed thinly as compared with the insulating layer (B) on the low capacitance portion 9, and made of a material having high thermal conductivity, as shown in FIG. 1-3.

Further, in the present invention, both insulating layer (A) and insulating layer (B) are made of a resin containing an inorganic powder. As the inorganic powder, alumina, boron nitride, magnesia, silica, silicon nitride, aluminum nitride or the like is preferably used. As the resin, an epoxy resin, a phenol resin, a polyimide resin, an engineering plastic or the like is preferably used. The material and the composition of the insulating layer (A) and the insulating layer (B) are not necessarily different, but as mentioned above, the material and the composition of them are selected in accordance with the balance in characteristics of a portion on which a power semiconductor is mounted and a portion on which a control semiconductor is mounted.

Further, in the present invention, it is preferred that a circuit portion (also called a pad portion) on which a control semiconductor is mounted is provided on the low capacitance portion embedded in the metal plate via the insulating layer (B). When such a structure is employed, as the insulating layer (B) covers the entire surface on the circuit side, a metal base circuit board excellent in electrical reliability will be obtained. Further, as shown in Examples described hereinafter, the metal base circuit board of the present invention can be obtained without complicated process, i.e. at a low cost.

The circuit 3 is made of any one of copper, aluminum and a clad foil comprising copper and aluminum, and it is preferably appropriately subjected to plating so that wire bonding or soldering of a component such as a semiconductor or a heat sink can easily be carried out. The material of the metal plate 7 is not particularly limited so long as it is a material excellent in thermal conductivity, and aluminum, an aluminum alloy, copper or a copper alloy, which has high thermal conductivity, is preferably selected. The thickness of the metal plate 7 is not particularly limited, and is usually from 0.5 mm to 3.0 mm.

FIG. 2-1 (*h*) illustrates one example of a metal base circuit board of the present invention, and FIGS. 2-1 (*a*) to (*g*) illustrate one example of its production process.

FIG. 2-1 (*a*) illustrates a metal plate to be used for the metal base circuit board, and is not particularly limited so long as it is made of a material excellent in thermal conductivity. Usually, aluminum, an aluminum alloy, copper or a copper alloy, which has high thermal conductivity, is preferably selected. The thickness of the metal plate is not particularly limited, and is usually from 0.5 mm to 3.0 mm.

In order to obtain the metal base circuit board of the present invention, a dent portion is formed as illustrated in FIG. 2-1 (*b*). The processing method therefor may be any method, but in the present invention, the dent portion is required to be provided on one side of the metal plate in such a state that the circumferential portion of the dent portion is not opened. By employing such a structure, an effect of suppressing such a phenomenon can be obtained that the insulating layer is separated from the side portion of the substrate due to a stress resulting from heat shrinkage of the metal base plate.

Further, in the present invention, with respect to the shape and the size of the dent portion, according to results of experimental studies by the present inventors, as described hereinafter, it is preferred that the maximum depth of the dent portion is from 10 to 50% of the thickness of the metal plate, the size of the dent portion as viewed from the vertical direction is at least 50% of the area of the metal plate, and in a shape of the dent portion as viewed from the vertical direction, the corner has a curvature radius of at least 2.5 mm. Here, "as viewed from the vertical direction" means a direction as shown in FIG. 2-2.

If the maximum depth of the dent portion is less than 10% of the thickness of the metal plate, the effect of the present invention is indefinite in some cases, and if it exceeds 50%, the metal plate itself tends to have a reduced strength and is likely to deform. If the size of the dent portion as viewed from the vertical direction is less than 50% of the area of the metal plate, no sufficient effect of the present invention will be obtained in many cases, and the control circuit can not sufficiently drawn on the same circuit board in some cases. Further, in a shape of the dent portion as viewed from the vertical direction, if a corner having a curvature radius less than 2.5 mm is present, high frequency characteristics or heat dissipation characteristics at said corner portion may be complicated, and no expected effect will be obtained in some cases.

Then, as shown in FIG. 2-1 (*d*), insulating layers made of the same material are provided both in the space in the dent portion and on the metal plate on which the dent portion is present. When the material forming the insulating layers is likely to shrink, it is possible to employ such a method that the space in the dent portion is once filled with a material forming insulating layers as shown in FIG. 2-1 (*c*), and after the material shrunk, an insulating layer made of the same material as the above insulating layer is provided on the entire surface of the insulating layer and the metal plate.

In the present invention, the insulating layer is required to have sufficient electrical insulating properties and further have high thermal conductivity or a low dielectric constant, and have high adhesive force with a metal, and accordingly it is usually made of a resin containing an inorganic filler as described hereinafter. Specifically, the resin containing an inorganic filler of the present invention is a curable resin composition comprising a combination of (1) a resin composed mainly of an epoxy resin, (2) a curing agent having a polyether skeleton and having a primary amine group at the terminal of its main chain and (3) an inorganic filler, and using the curable resin composition, a cured product excellent in stress relaxation properties, electrical insulating properties, heat dissipation properties, heat resistance and moisture resistance can be provided.

As the epoxy resin, a general purpose epoxy resin such as a bisphenol F epoxy resin or a bisphenol A epoxy resin may be used. When at least one member selected from an epoxy resin having a dicyclopentadiene skeleton, an epoxy resin having a naphthalene skeleton, an epoxy resin having a biphenyl skeleton and an epoxy resin having a novolac skeleton is contained in an amount of at least 10 mass % in the total epoxy resin, balance between stress relaxation properties and moisture resistance further improves. The typical epoxy resin having a novolac skeleton may be a phenol novolac epoxy resin or a cresol novolac epoxy resin, and an epoxy resin having a dicyclopentadiene skeleton, a naphthalene skeleton or a biphenyl skeleton and a novolac skeleton in combination may also be used. Further, as the epoxy resin, an epoxy resin having the above skeleton may be used alone. Further, it is possible to blend with an epoxy resin as the main component, another resin such as a thermosetting resin such as a phenol resin or a polyimide resin or a phenoxy resin, or a polymer resin such as an acrylic rubber or an acrylonitrile-butadiene rubber. However, considering the balance of stress relaxation properties, electrical insulating properties, heat resistance and moisture resistance, the blend amount of the polymer resin is preferably at most 30 mass % to the total amount with the epoxy resin.

As the curing agent, a curing agent having a polyether skeleton and having a primary amine group at the terminal of its main chain is used so as to decrease the storage elastic modulus of the resin composition after cured, and it is possible to use another curing agent in combination. When an aromatic amine curing agent is used in combination, more favorable balance of stress relaxation properties, electric insulating properties, moisture resistance, etc. will be obtained. As the aromatic amine curing agent, diaminodiphenylmethane, diaminodiphenylsulfone, metaphenylenediamine or the like may be used. A curing agent such as a phenol novolac resin may further be used in combination.

As the inorganic filler, one having favorable electric insulating properties and further having a high coefficient of thermal conductivity is used. Such a filler may, for example, be aluminum oxide, aluminum nitride, silicon nitride, boron nitride or silica, and they may be used alone or as mixed. Among them, aluminum oxide is preferred since spherical particles with which a high filling ratio is achieved is easily available at a low cost.

When the above-described curable resin composition is utilized as an insulating layer, the adhesion with a conductor circuit can be more improved by blending a silane coupling agent such as epoxy silane or amino silane with the resin composition. Further, when it is utilized as an insulating layer, the thickness is determined considering stress relaxation properties, heat dissipation properties, insulating reliability, productivity, etc., and is usually at a level of from 50 to 150 μm.

In the present invention, the resin containing an inorganic filler has a storage elastic modulus after cured of preferably at most 15,000 MPa at 300 K. If it exceeds 15,000 MPa, the stress relaxation properties may be poor in some cases. On the other hand, the lower limit is not particularly limited, but is preferably at least 100 MPa at 300 K since there is possibility that the insulating layer is deformed when a great external force is applied thereto, thus impairing insulating reliability.

Then, a metal foil is disposed on the entire surface of the insulating layer of the structure shown in FIG. 2-1 (*d*) and heated so that they are unified, to obtain a structure shown in FIG. 2-1 (*e*). The metal foil used here, which becomes a circuit after processed, is a foil of a metal excellent in conductivity, such as one of copper, aluminum, nickel, iron, tin, silver and titanium, an alloy containing two or more of such metals, or a clad foil using the above metal or alloy. The foil is prepared either by an electrolytic method or a calendering method, and metal plating such as Ni plating, Ni—Au plating or solder plating may be applied on the foil. It is more preferred that the surface on the side to be in contact with the insulating adhesive layer of the conductor circuit is preliminarily subjected to roughening treatment e.g. by etching or plating in view of adhesion with the insulating adhesive layer.

An etching resist is applied (see FIG. 2-1 (*f*)) to a predetermined position on the metal foil of the structure of FIG. 2-1 (*e*), the metal foil is subjected to etching using a predetermined etching liquid to form circuits on the metal foil (see FIG. 2-1 (*g*)), and then the etching resist is separated to obtain a metal base circuit board of the present invention as shown in FIG. 2-1 (*h*).

The metal base circuit board of the present invention, utilizing the above characteristics in structure, has such characteristics that, for example, at the time of forming the circuits, a portion on which a control semiconductor is mounted is prepared on the circuit at a deep space portion, and a portion on which a control semiconductor is mounted is prepared on the circuit at a shallow space portion, whereby a hybrid integrated circuit having both control semiconductor and power semiconductor can be formed on one circuit board, and accordingly the metal base circuit board of the present invention is suitable as a circuit board to be used for a hybrid integrated circuit for various applications.

FIG. 3-1 illustrates an example of a hybrid integrated circuit employing a metal base circuit board of the present invention. The hybrid integrated circuit comprises a metal base circuit board comprising a metal plate 31, an insulating layer 32 and circuits 35, and a plurality of semiconductors i.e. a power semiconductor 37 and a control semiconductor 38 mounted on the circuits 35. When the power semiconductor 37 is connected to the circuit 35, a heat spreader 36 is interposed therebetween in many cases for the purpose of accelerating heat dissipation, but the heat spreader 36 is not used in some cases. Further, the control semiconductor 38 is connected to the circuit 35 with no heat spreader interposed therebetween since the control semiconductor 38 does not usually generate a large quantity of heat, however, needless to say, a heat spreader may be interposed therebetween. Further, in FIG. 3-1, signals from the control semiconductor 38 are electrically connected to the power semiconductor 37 through the circuit 35 and a bonding wire 34.

The present invention is characterized in that a low dielectric constant portion 33 is provided at least under a circuit which is electrically connected directly to the control semiconductor 38. By such a structure, the present invention has such characteristics that it can be applicable to a hybrid integrated circuit for such an application that concurrent heat dissipation from the control semiconductor is insufficient, and no sufficient operating time can be secured, to which a conventional metal base circuit board can not be applied.

In the present invention, a part of the metal plate 31 is replaced with a material having a dielectric constant lower than that of the metal plate, and the material is not particularly limited. For example, a metal base circuit board wherein dent portions are provided on the surface of the metal plate 31, and the dent portions are filled with a resin containing an inorganic filler, can be obtained without any significant change of a process for producing a conventional metal base circuit board. Further, such a metal base circuit board is particularly preferred since a material excellent in connectivity with the insulating layer 2 and the metal plate 31 is likely to be selected.

With respect to the dent portion, according to studies by the present inventors, the angle θ formed by its side wall and its bottom preferably has a gradient of from 35° to 65° as shown in FIG. 3-2. If it is less than 35°, the area of the side wall portion tends to be large, and it is required that the dent portion is sufficiently large so as to secure the capacitance. If the gradient exceeds 65°, if there is a corner between the side wall and the bottom of the dent portion, a void portion is likely to remain at the corner. In either case, electrical characteristics of the obtained metal base circuit board are likely to be deteriorated. Further, the shape of the bottom of the dent portion is not particularly limited, but it is preferably plane, since a production method excellent in mass productivity such as a mechanical method such as pressing or cutting or a chemical method such as etching with a chemical can be applied as a method of forming dents on a metal plate.

Further, with respect to the shape of the dent portion, the dimension of the dent portion when the metal base circuit board is viewed from the upward direction is larger than the circuit on which a control semiconductor is mounted and the circuit to which high frequency signals or the like are transmitted, when the metal base circuit board is used as a hybrid integrated circuit. The thickness (depth) varies depending upon e.g. the material of the insulating adhesive forming the insulating layer, and a thickness of from 50 to 800 μm is usually sufficient. The depth of the dent portions varies with each dent portion, but the dent portions preferably have the same depth, whereby processing can be carried out all at once.

Further, in the present invention, the resin containing an inorganic filler, with which the dent portions are filled, is not particularly limited so long as it has a low dielectric constant, but preferred is one having high thermal conductivity.

The inorganic filler may, for example, be aluminum oxide, silicon oxide, aluminum nitride or boron nitride, and among them, aluminum oxide, silicon oxide or boron nitride is preferred, with which a low dielectric constant portion can be obtained with favorable balance between low dielectric constant and high coefficient of thermal conductivity. The shape of particles constituting the inorganic filler is not particularly limited, but spherical particles are preferred in view of improvement in fluidity, and an inorganic filler consisting of particles having a hollow is more preferred since the dielectric constant at the low dielectric constant portion further decreases. Particularly, according to results of studies by the present inventors, fused silica (silicon dioxide) comprising from 3.5 to 45.0 vol % of particles having an average particle size of from 0.3 to 5.0 μm and from 18.0 to 80.0 vol % of particles having an average particle size of from 6 to 30 μm is excellent in high filling properties and is more preferred since a low dielectric constant portion having favorable balance between low dielectric constant and high coefficient of thermal conductivity can be stably and securely obtained.

As the resin, a thermosetting resin such as an epoxy resin, a phenol resin or a polyimide resin, an engineering plastic, a thermoplastic resin such as a polyethylene, a polypropylene, vinylidene chloride, a polyethylene terephthalate, an ABS resin or an AS resin, or an acrylic resin, a silicone resin or a urethane resin may, for example, be used. Among them, it is preferred to use the same resin as for the insulating layer, and an epoxy resin is preferably used, which has favorable adhesion with the metal plate.

In the present invention, the material of the metal plate is not particularly limited so long as it is excellent in thermal conductivity, and aluminum, an aluminum alloy, copper or a copper alloy, which has high thermal conductivity, is preferably selected. The thickness of the metal plate is not particularly limited and is usually from 0.3 mm to 4.0 mm.

In the present invention, the composition and characteristics of the insulating layer are also very important. The insulating layer is formed by a resin containing an inorganic filler. As the inorganic filler, an electrically insulating inorganic compound such as alumina (aluminum oxide), boron nitride, magnesia (magnesium oxide), barium sulfate, zinc oxide, silica (silicon dioxide), silicon nitride or aluminum nitride is used, and alumina, boron nitride, aluminum nitride or silica which is easily available at a low cost, is preferably used. Among them, alumina or aluminum nitride is more preferably selected, since their particles are spherical and a high filling ratio can be achieved, and an insulating layer having extremely high thermal conductivity can easily be obtained.

As the resin, a thermosetting resin such as an epoxy resin, a phenol resin or a polyimide resin, an engineering plastic, a thermoplastic resin such as a polyethylene, a polypropylene, vinylidene chloride, a polyethylene terephthalate, an ABS resin or an AS resin, or an acrylic resin, a silicone resin, a urethane resin or a fluororesin may, for example, be used, and particularly, an epoxy resin which is excellent in connectability with the metal plate is preferably selected.

Namely, in the present invention, as the combination of the inorganic filler and the resin, an epoxy resin containing one or more of alumina, boron nitride, aluminum nitride and silica is a preferred combination since it has high adhesive force with the metal plate or a metal foil forming a circuit, and an insulating layer having a high coefficient of thermal conductivity or having a low capacitance after cured can easily be obtained. Further, the same applies to a resin containing an inorganic filler constituting the above low dielectric constant portion.

As a method of applying the resin containing an inorganic filler in an uncured state (hereinafter sometimes referred to simply as insulating adhesive) to a predetermined portion, generally, a roll coater, a gravure coater, a kiss roll coater or screen printing may, for example, be employed. Further, the insulating adhesive is formed in a single layer or in plural layers. When it is formed in plural layers, the process becomes long, thus increasing the cost, but dielectric breakdown resistance improves and further, the accuracy of thickness of the insulating layer improves.

In the present invention, as a material of the circuit and a metal foil forming it, any one of copper, aluminum, nickel, iron, tin, silver and titanium, an alloy containing two or more of such metals, or a clad foil using the above metal or alloy, may, for example, be used. Further, the metal foil may be prepared either by an electrolytic method or a calendering method, and metal plating such as Ni plating, Ni—Au plating or solder plating may be applied on the metal foil. It is more preferred that the surface on the side to be in contact with the insulating adhesive of the metal foil (circuit) is preliminarily subjected to roughening treatment e.g. by etching or plating in view of adhesion with the insulating adhesive.

Some of the circuits of the metal base circuit board of the present invention are on the metal plate via an insulating layer, and the others are on the metal plate via an insulating layer and a low dielectric constant portion. In production of a hybrid integrated circuit employing the metal base circuit board of the present invention, by mounting control electronic components such as a resistor chip and a condenser chip on the latter circuits, distortion of signals from the control semiconductor can be reduced, and by mounting a power semiconductor, a control semiconductor, etc. on the former circuits, excessive increase in temperature of the semiconductors and the resulting malfunction can be prevented. As a result, such an effect that highly reliable operation can be secured as the whole hybrid integrated circuit, can be obtained.

In the embodiment of the present invention, regarding the above dent portion, the corner portion as viewed from the upward direction has a curvature radius (roundness) of at least 0.4 mm as shown in FIG. 3-3. With respect to the shape of the dent portion, the dent portion is formed along the shape of a circuit mounted on the low dielectric constant portion, since the thermal conductivity at the low dielectric constant portion is lower than that of the metal plate. As its shape, usually a square or a rectangle is employed in many cases, but a polygon such as a triangle, a pentagon or a hexagon or a round shape such as a circle or an ellipse may be employed in some cases.

The present inventors have conducted experimental studies on the shape of the dent portion and as a result, found that when the corner portion has a curvature radius of at least 0.4 mm, no void will remain at the corner of the dent, whereby a metal base circuit board having predetermined characteristics can be stably obtained, and accomplished the present invention. The present invention is characterized in that the smallest corner portion has a curvature radius (roundness) of at least 0.4 mm, regardless of the shape of the dent portion as viewed from the upward direction, i.e. a polygon or a round shape.

Further, with respect to the shape of the dent portion, the dent portion should be larger than the circuit on which a control semiconductor is mounted and a circuit to which high frequency signals or the like are transmitted, when the metal base circuit board is viewed from the upward direction. The thickness (depth) varies depending upon e.g. the material of the insulating adhesive forming an insulating layer, and is usually from 50 to 800 μm.

The concave-convex shape of the dent portions is not particularly limited, but the bottoms are preferably plane, i.e. the dent portions have the same depth, whereby a production method excellent in mass productivity such as a mechanical method such as pressing or cutting or a chemical method such as etching with a chemical can be applied as a method of forming dents on the metal plate.

Figures 1, 2, 3, 4:
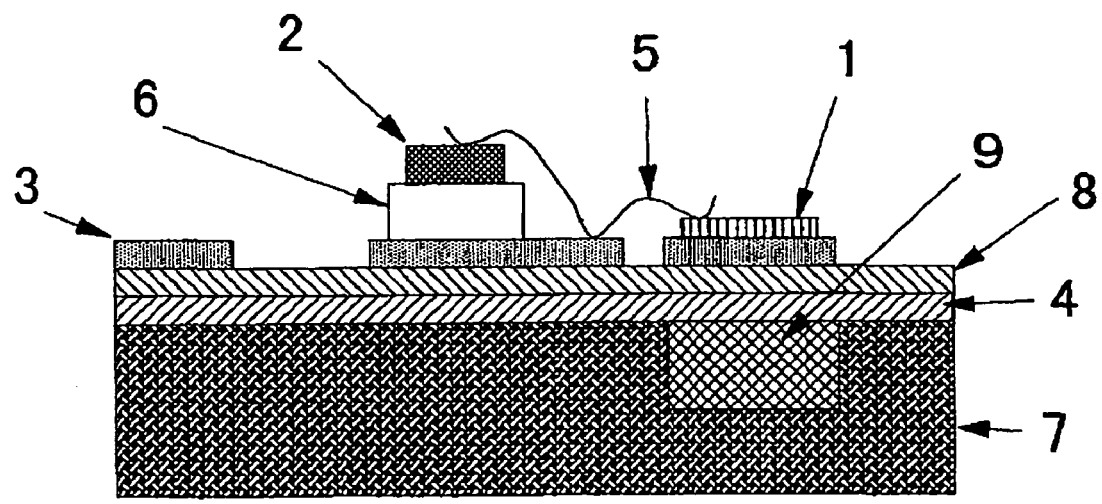
Figure 2:
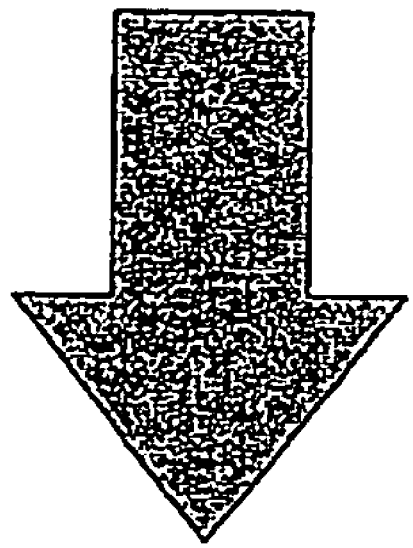
Figure 2:
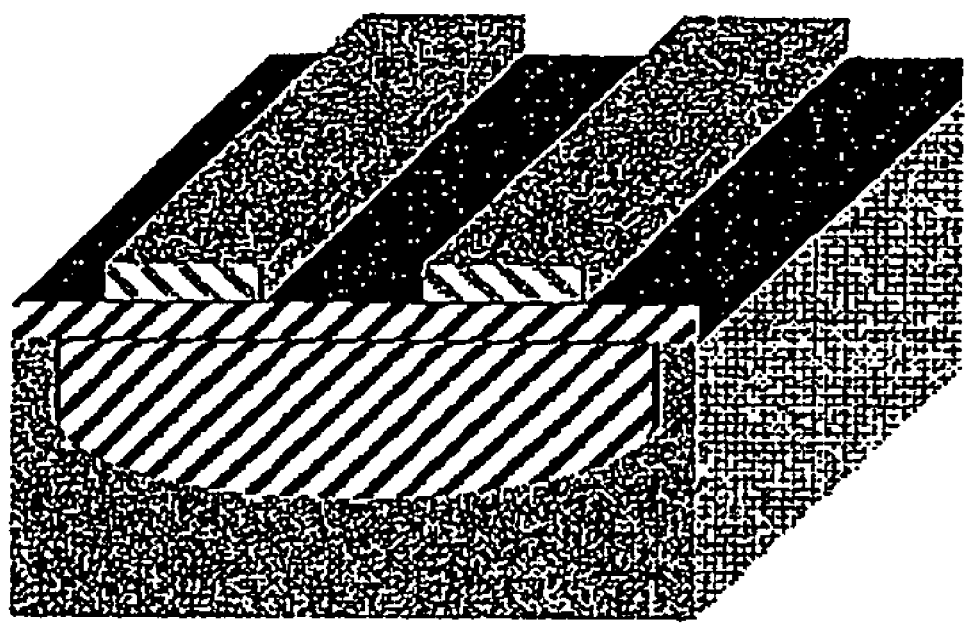
Figures 2, 3:
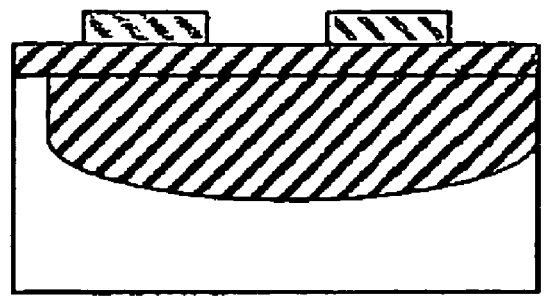
Figures 2, 3, 4:
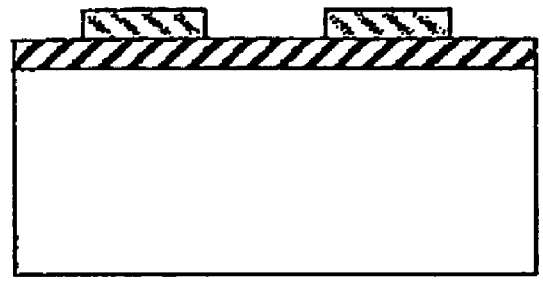
Figures 1, 3:
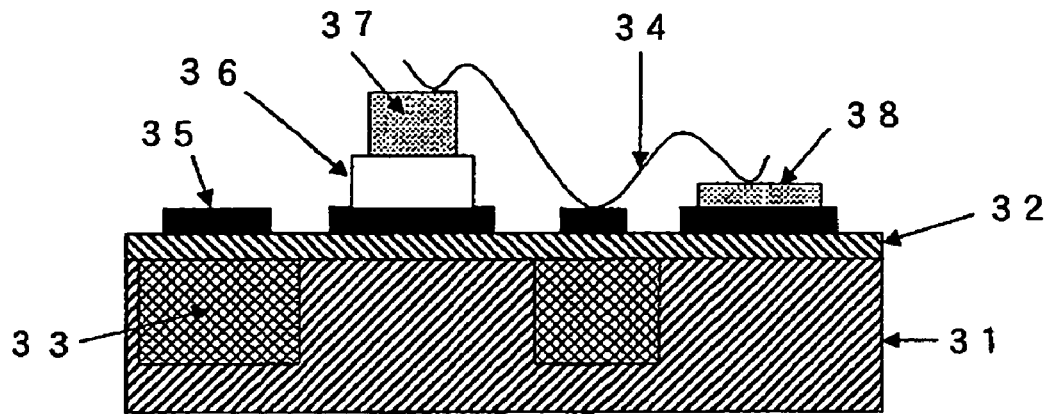
Figures 2, 3:
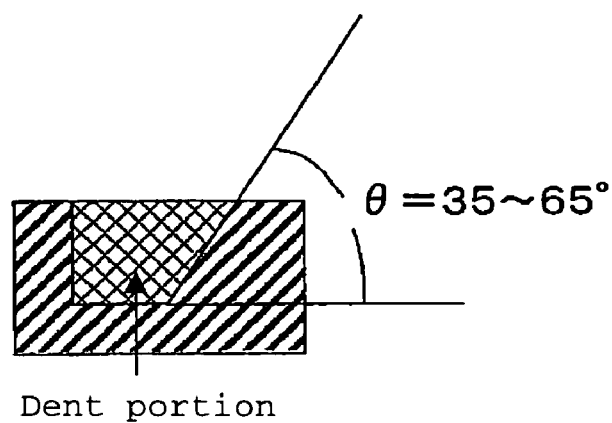
Figure 3:
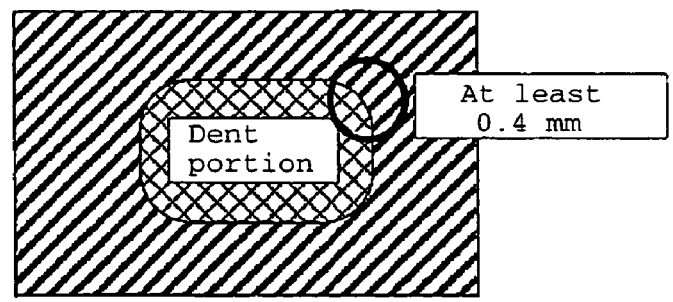
Figures 1, 4:
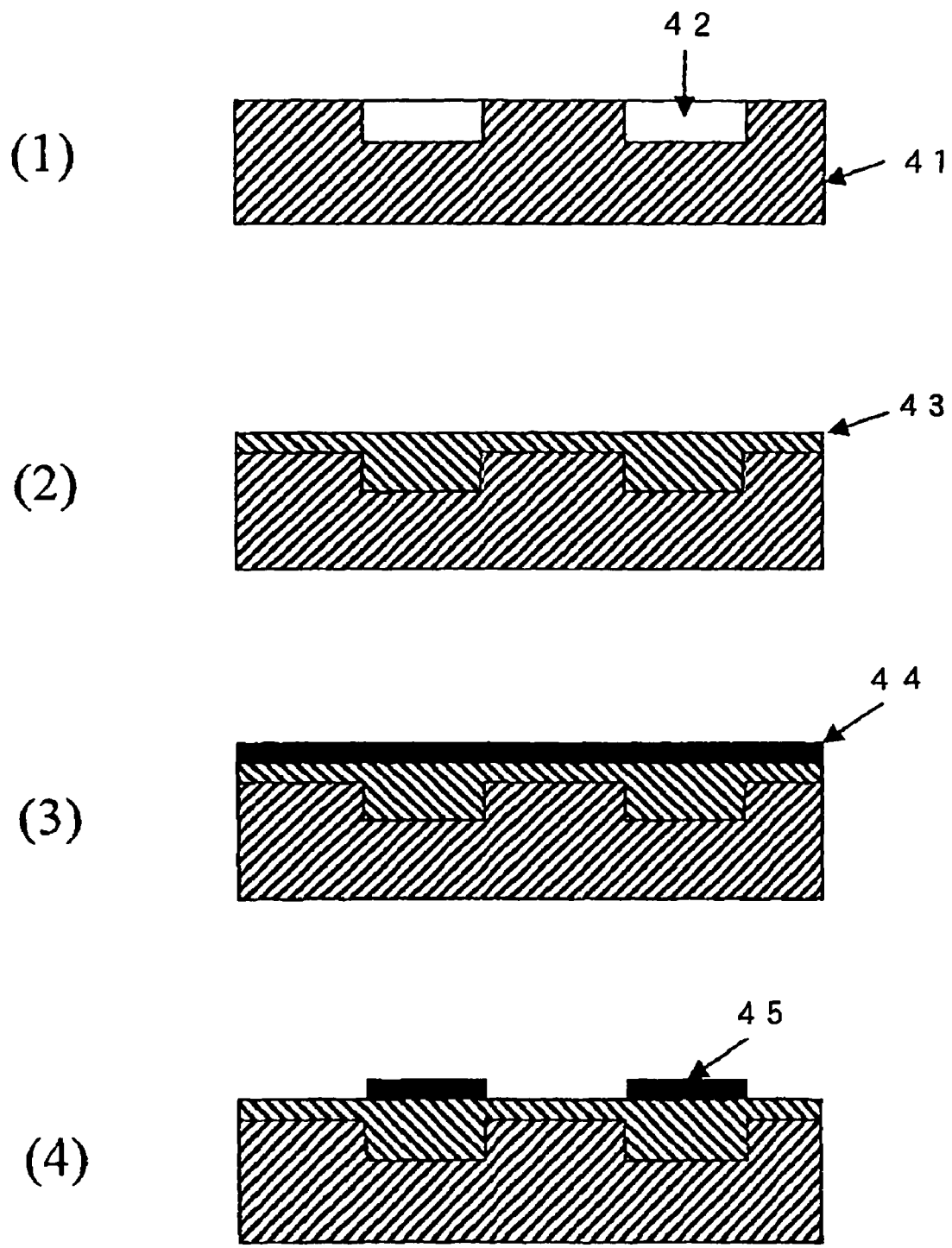
Figures 2, 4:
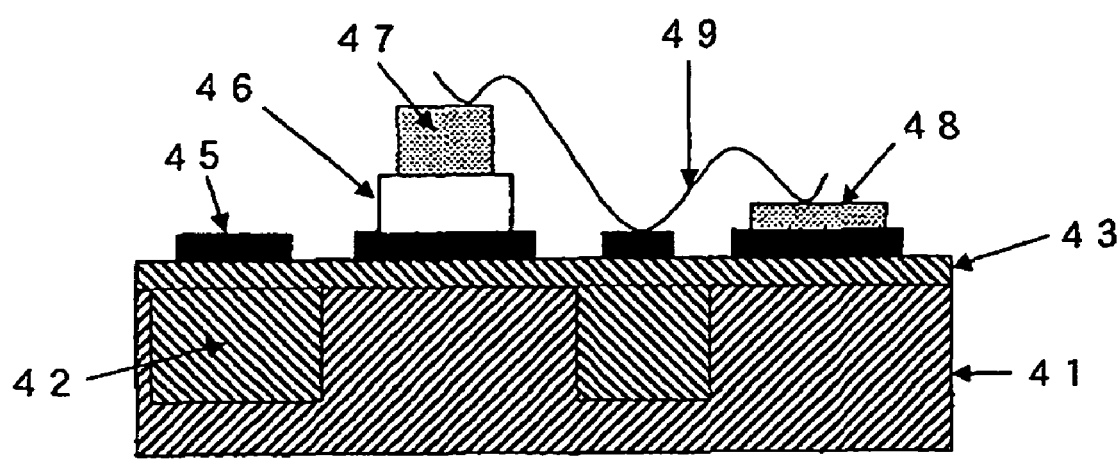

FIG. 4-1 is drawings illustrating a process for producing a metal base circuit board of the present invention. First, concave portions are formed on desired portions on the surface of a metal plate (see FIG. 4-1 (1)). As a method of forming the concave portions, a conventional method such as pressing, cutting or etching with a chemical may be mentioned. The metal plate used is not particularly limited so long as it is made of a material excellent in thermal conductivity, and aluminum, an aluminum alloy, copper or a copper alloy, which has high thermal conductivity, is preferably selected. Further, the thickness of the metal plate is not particularly limited and is usually from 0.3 mm to 4.0 mm.

With respect to the shape of the concave portion of the metal plate, the dimension of the concave portion when the metal base circuit board is viewed from the upward direction should be larger than a circuit on which a control semiconductor is mounted and a circuit to which high frequency signals or the like are transmitted, when the metal base circuit board is used as a hybrid integrated circuit. Further, although the thickness (depth) varies depending upon e.g. the material of an insulating adhesive forming an insulating layer, it is usually from 50 to 500 μm. Further, the depth of the concave portion may vary with each concave portion, but all the concave portions preferably have the same depth, whereby processing can be carried out all at once.

Then, an insulating adhesive is applied to the above concave portions and the metal plate other than the concave portions to the same level of height (see FIG. 4-1 (2)). As a method of applying the insulating adhesive, usually a roll coater, a gravure coater, a kiss roll coater or screen printing may, for example, be employed. Further, the insulating adhesive is formed in a single layer or plural layers. In a case where the insulating adhesive is formed in plural layers, the process becomes long, thus increasing the cost, but dielectric breakdown resistance improves and further, the accuracy of thickness of the insulating layer improves.

Then, a metal foil is provided on the surface of the insulating adhesive to form a metal assembly (see FIG. 4-1 (3)), and then the metal foil of the metal assembly is processed to form circuits (see FIG. 4-1 (4)). As a material of the metal foil used in the present invention and the circuits formed from the metal foil, any one of copper, aluminum, nickel, iron, tin, silver and titanium, an alloy containing two or more of such metals or a clad foil using the above metal or alloy may, for example, be used. The metal foil may be prepared either by an electrolytic method or a calendering method. Metal plating such as Ni plating, Ni—Au plating or solder plating may be applied on the metal foil. It is more preferred that the surface on the side to be in contact with the insulating adhesive of the metal foil (circuit) is preliminarily subjected to roughening treatment e.g. by etching or plating, in view of adhesion with the insulating adhesive.

FIG. 4-2 is a drawing illustrating one example of a hybrid integrated circuit employing a metal base circuit board obtained by the process for producing a metal base circuit board of the present invention. As shown in FIG. 4-2, on the metal base circuit board of the present invention, at least two types of circuits i.e. circuits provided on portions where the insulating layer is locally thick (corresponding to the concave portions provided on the metal plate) and circuits provided on portions where the insulating layer is not locally thick (corresponding to portions other than the concave portions of the metal plate) are provided. By mounting control electronic components such as a resistor chip and a condenser chip on the former circuits, distortion of signals from a control semiconductor can be reduced, and by mounting a power semiconductor, a control semiconductor, etc. on the latter circuits, excessive increase in temperature of the semiconductors and the resulting malfunction can be prevented, whereby highly reliable operation can be secured as the whole hybrid integrated circuit.

In the present invention, the composition and characteristics of the insulating adhesive are very important. In the present invention, the insulating adhesive is made of a resin containing an inorganic filler. As the inorganic filler, an inorganic substance such as alumina (aluminum oxide), boron nitride, magnesia (magnesium oxide), barium sulfate, zinc oxide, silica (silicon dioxide), silicon nitride or aluminum nitride is preferably used. As the resin, a thermosetting resin such as an epoxy resin, a phenol resin or a polyimide resin, an engineering plastic, a thermoplastic resin such as a polyethylene, a polypropylene, vinylidene chloride, a polyethylene terephthalate, an ABS resin or an AS resin, or an acrylic resin, a silicone resin or a urethane resin may, for example, be preferably used.

As the combination of the inorganic filler and the resin, an epoxy resin containing one or more of alumina, boron nitride, aluminum nitride and silica is more preferred, which has high adhesion with the metal plate or the metal foil, and with which an insulating layer having a high coefficient of thermal conductivity or an insulating layer having a low capacitance after cured can easily be obtained.

In the present invention, the insulating adhesive has a coefficient of thermal conductivity after cured of preferably at least 1.3 W/mK. When an insulating adhesive having a high coefficient of thermal conductivity is used, a hybrid integrated circuit having higher reliability can be obtained, and it can be used as a hybrid integrated circuit to be used for vehicles such as automobiles and trains, for example.

Further, in the present invention, it is preferred that the capacitance per unit area between the metal plate and the circuit in the concave portion filled with the insulating adhesive is at most 50 $pF/cm^2$, and the capacitance per unit area between the metal plate and the circuit at a portion other than the concave portion is at least 50 $pF/cm^2$ and at most 160 $pF/cm^2$, whereby more remarkable effects of the present invention will be obtained, and a practical hybrid integrated circuit to be used for vehicles such as automobiles and trains, for example, can be provided.

Now, the metal base circuit board and its production process of the present invention will be explained in detail below with reference to Examples.

EXAMPLE 1-1

As shown in FIG. 1-5 (1), an insulating layer (A) 10 with a thickness of 20 μm made of an epoxy resin containing 60 vol % of alumina was provided on a desired position on an aluminum plate of 50 mm×50 mm×(thickness mm), and the metal plate 7 was subjected to etching employing the insulating layer (A) as a mask to form concave portions 11 with a depth of 300 μm on the surface of the metal plate (FIG. 1-5 (2)).

The concave portions 11 on the metal plate 7 were filled with an epoxy resin containing 60 vol % of silica to the same level of height as the surface of the insulating layer (A) 10 to form low capacitance portions 12 (FIG. 1-5 (3)).

Then, an insulating layer (B) 13 made of an epoxy resin containing 60 vol % of alumina was formed in a thickness of 30 μm (FIG. 1-5 (4)), and further, a metal foil 14 was laminated to obtain a metal base board (FIG. 1-5 (5)).

Using the metal base board, a circuit (pad portion) on which a control semiconductor is mounted and another desired circuit 3 were formed from the metal foil located on the low capacitance portion to prepare a metal base circuit board to be used for a hybrid integrated circuit containing a power semiconductor and a control semiconductor to control the power semiconductor.

Using the metal base circuit board, a digital amplifier (hybrid integrated circuit) wherein a digital signal IC as a control semiconductor and MOS-FET as a power semiconductor were mounted on the circuits was experimentally produced and operated at an operating frequency of 600 kHz and as a result, normal operation was confirmed.

EXAMPLE 1-2

In the same manner as in Example 1-1 except that a metal plate having concave portions on one principal plane was preliminarily prepared by etching, and an insulating layer (A) was provided on the surface of the metal plate to prepare a metal plate having a structure shown in FIG. 1-5 (2), a metal base circuit board was prepared, and a digital amplifier was prepared and operated and as a result, it was confirmed that it normally operated continuously for at least 1 hour at an operating frequency of 600 kHz.

COMPARATIVE EXAMPLE 1-1

An aluminum plate was coated with an epoxy resin containing 60 vol % of alumina in a thickness of 50 μm, and a copper foil was laminated thereon to prepare a metal base board. Using the metal base board, the same operation as in Example 1-1 was carried out to prepare a metal base circuit board, and a digital amplifier was prepared and operated and as a result, it malfunctioned. The operating frequency-was 600 kHz, which was the same as in Example 1-1.

COMPARATIVE EXAMPLE 1-2

An epoxy resin containing 60 vol % of silica was formed in a thickness of 300 μm on an aluminum plate, and a copper foil was laminated to prepare a metal base board. Using the metal base board, the same operation as in Example 1-1 was carried out to prepare a metal base circuit board, and a digital amplifier was prepared and operated. As a result, it normally operated at the beginning of operation at an operating frequency of 600 kHz, but it stopped operating after operation for five seconds due to heat generation of a power transistor.

EXAMPLES 2-1 TO 2-4 AND COMPARATIVE EXAMPLES 2-1 AND 2-2

A thermosetting resist ink was applied to a desired position on an aluminum plate of 50 mm×50 mm×2 mm, and a dent portion with a size and a depth as shown in Table 2-1 was formed by alkali etching, and then the resist ink was removed.

Then, 100 parts by mass of a bisphenol F epoxy resin (Epikote 807: epoxy equivalent=173, manufactured by Japan Epoxy Resins Co., Ltd.) as an epoxy resin, 5 parts by mass of γ-glycidoxypropylmethyldiethoxysilane (AZ-6165: manufactured by Nippon Unicar Company Limited) as a silane coupling agent and 500 parts by mass of alumina (AS-50: manufactured by SHOWA DENKO K. K.) having an average particle size of 5 μm as an inorganic filler were mixed by a universal mixer.

To the above mixture, 25 parts by mass of a polyoxypropyleneamine (JEFFAMINE T-403: manufactured by Texaco Chemical Company) and 20 parts by mass of a polyoxypropylene amine (JEFFAMINE D2000, manufactured by Texaco Chemical Company) were blended and mixed to obtain a resin, and the above-described dent portion was filled with an insulating material made of the above prepared resin in a thickness of 20 μm, and further, an insulating layer was formed in a thickness of 30 μm. Further, a copper foil was laminated to obtain a metal base board. Further, with respect to the metal base board, the copper foil was subjected to etching with a ferric chloride solution to form circuits having pad portions on which a chip resistor can be mounted, whereby a metal base circuit board was obtained.

The metal base circuit board was subjected to a heat cycle test described hereinafter, and the results are shown in Table 2-1.

Heat Cycle Test Method

A chip resistor with a size of 2.0 mm×1.25 mm is soldered between the pads, and a test is carried out with one cycle being from −40° C. for seven minutes to +125° C. for seven minutes, and presence or absence of cracks at the soldered portion is observed by a microscope. The number of cycles when occurrence of cracks at the soldered portion becomes 50% or higher is taken as the index of heat cycle resistance.

liquid epoxy resin (EP828, manufactured by Japan Epoxy Resins Co., Ltd.) and mixed to prepare an insulating adhesive A.

Further, fused spherical silica (FB-1SDX, manufactured by Denki Kagaku Kogyo Kabushiki Kaisha) having an average particle size of 1.7 μm in an mount of 37 vol % and fused spherical silica (FB-550, manufactured by Denki Kagaku Kogyo Kabushiki Kaisha) having an average particle size of 11.3 in an amount of 40 vol % were blended with a bisphenol A liquid epoxy resin (EP828, manufactured by Japan Epoxy Resins Co., Ltd.) and mixed to prepare an insulating adhesive B.

The insulating adhesive B was applied to the aluminum plate having the dent portions, and then the insulating adhesive A was applied so that the thickness of the insulating layer at a portion other than the dent portions would be 50 μm. Further, a copper foil was laminated on the insulating adhesive A to obtain a metal base board.

With respect to the metal base board, the copper foil was subjected to etching with a desired position masked with an etching resist, and then the etching resist was removed, followed by washing and drying to form circuits, whereby a metal base circuit board was obtained. For formation of the circuits, circuits on which a resistor chip or a condenser which was to be electrically connected directly from a control semiconductor were formed on the dent portions, and circuits on which a power semiconductor or a control semiconductor was to be mounted were formed on a portion other than the dent portions.

With respect to the metal base circuit board obtained by the above operation, the dielectric breakdown voltage and the capacitance per unit area were measured. The dielectric breakdown voltage was measured in accordance with JIS C2110. Further, the capacitance per unit area was obtained in such a manner that the capacitance at a measurement frequency of 1 MHz was obtained by an LCR meter, and the area

TABLE 2-1

| | | Dent portion | | | | | | |
|---|---|---|---|---|---|---|---|---|
| | No. | Opening to the circumference | Proportion to the whole area of the metal plate (%) | Maximum depth (μm) | Number | Minimum shape (mm) | Maximum Shape (mm) | Agreement with a portion on which a chip resistor is mounted | Heat cycle resistance (cycles) |
| Ex. | 2-1 | Nil | 81.0 | 800 | 1 | 45 × 45 (corner portion: 3R) | | Present | 3,000 |
| | 2-2 | Nil | 64.3 | 400 | 2 | 32 in diameter | | Present | 2,500 |
| | 2-3 | Nil | 59.7 | 400 | 4 | 10 in diameter | 40 in diameter | Present | 2,500 |
| | 2-4 | Nil | 62.8 | 300 | 5 | 20 in diameter | | Present | 2,500 |
| Comp. Ex. | 2-1 | Present | 81.0 | 800 | 1 | 45 × 45 (corner portion: 3R) | | Present | Insulating layer cracked |
| | 2-2 | Nil | 0.0 | — | — | — | | Nil | 1,000 |

EXAMPLE 3-1

A thermosetting resist ink was applied to a desired position on an aluminum plate of 150 mm×150 mm×1.5 mm, and dents with a depth of 300 μm and a gradient at the side wall of 43° were formed by etching, and then the resist ink was removed.

Then, alumina (LS-20, manufactured by Nippon Light Metal Company, Ltd.) having an average particle size of 2 μm was blended in an amount of 45 vol % with a bisphenol A of the portion which was in contact with the insulating adhesive of a circuit at the measured portion was obtained, and the capacitance was divided by the area of the circuit. Principal preparation conditions of the metal base circuit board and the measurement results are shown in Table 3-1.

TABLE 3-1

| | | Ex. | Comp. Ex. |
|---|---|---|---|
| Dent portion | Dielectric breakdown voltage (kV) | 6.4 | |
| | Capacitance (pF/cm$^2$) | 10 | |

TABLE 3-1-continued

|  |  | Ex. | Comp. Ex. |
|---|---|---|---|
| Other portion | Dielectric breakdown voltage (kV) | 4.2 | 3.6 |
|  | Capacitance (pF/cm$^2$) | 130 | 128 |
| Operation of hybrid integrated circuit |  | ○ | X |

Then, using the metal base circuit board, a hybrid integrated circuit as shown in FIG. 3-1 was prepared. The hybrid integrated circuit is a digital amplifier having a digital signal IC as a control semiconductor and MOS-FET as a power semiconductor mounted. The hybrid integrated circuit was operated at an operating frequency of 1.2 MHz and as a result, normal operation was confirmed.

COMPARATIVE EXAMPLE 3-1

The same operation as in Example 3-1 was carried out except that a flat aluminum plate with no dents was used, and that the insulating adhesive A was applied in a thickness of 50 μm on the aluminum plate, a metal base board was prepared, and then a metal base circuit board was prepared. The results of measurement of the metal base circuit board are shown in Table 3-1. Further, in the same manner as in Example 3-1, a digital amplifier was prepared and operated and as a result, it malfunctioned.

EXAMPLE 4-1

A thermosetting resist ink was applied to a desired position on an aluminum plate of 150 mm×150 mm×1.5 mm, and dent portions which were rectangular as viewed from the upward direction and the corner portions of which had a roundness (R) of at least 0.6 R were formed with a depth of 300 μm by etching, and then the resist ink was removed.

Then, alumina (LS-20, manufactured by Nippon Light Metal Company, Ltd.) having an average particle size of 2 μm was blended in an amount of 45 vol % with a bisphenol A liquid epoxy resin (EP828, manufactured by Japan Epoxy Resins Co., Ltd.) and mixed to prepare an insulating adhesive A.

Further, fused spherical silica (FB-1SDX, manufactured by Denki Kagaku Kogyo Kabushiki Kaisha) having an average particle size of 1.7 μm in an mount of 37 vol % and fused spherical silica (FB-550, manufactured by Denki Kagaku Kogyo Kabushiki Kaisha) having an average particle size of 11.3 in an amount of 40 vol % were blended with a bisphenol A liquid epoxy resin (EP828, manufactured by Japan Epoxy Resins Co., Ltd.) and mixed to prepare an insulating adhesive B.

The insulating adhesive B was applied to the aluminum plate having the dent portions, and then the insulating adhesive A was applied so that the thickness of the insulating layer at a portion other than the dent portions would be 50 μm. Further, a copper foil was laminated on the insulating adhesive A to obtain a metal base board.

With respect to the metal base board, the copper foil was subjected to etching with a desired position masked with an etching resist, and then the etching resist was removed, followed by washing and drying to form circuits, whereby a metal base circuit board was obtained. For formation of the circuits, circuits on which a resistor chip or a condenser which was to be electrically connected directly from a control semiconductor were formed on the dent portions, and circuits on which a power semiconductor or a control semiconductor was to be mounted were formed on a portion other than the dent portions.

With respect to the metal base circuit board obtained by the above operation, the dielectric breakdown voltage and the capacitance per unit area were measured. The dielectric breakdown voltage was measured in accordance with JIS C2110. Further, the capacitance per unit area was obtained in such a manner that the capacitance at a measurement frequency of 1 MHz was obtained by an LCR meter, and the area of the portion which was in contact with the insulating adhesive of a circuit at the measured portion was obtained, and the capacitance was divided by the area of the circuit. The metal base circuit board obtained in the present Example had the same characteristics as in Example 3-1.

Then, using the metal base circuit board, a hybrid integrated circuit as shown in FIG. 3-1 was prepared. The hybrid integrated circuit is a digital amplifier having a digital signal IC as a control semiconductor and MOS-FET as a power semiconductor mounted. The hybrid integrated circuit was operated at an operating frequency of 1.2 MHz and as a result, normal operation was confirmed.

EXAMPLE 5-1

A thermosetting resist ink was applied to a desired position on an aluminum plate of 150 mm×150 mm×1.5 mm, and concave portions with a depth of 200 μm were formed by etching, and then the resist ink was removed.

Then, alumina (LS-20, manufactured by Nippon Light Metal Company, Ltd.) having an average particle size of 2 um was blended in an amount of 45 vol % with a bisphenol A liquid epoxy resin (EP828, manufactured by Japan Epoxy Resins Co., Ltd.) and mixed to prepare an insulating adhesive.

The insulating adhesive was applied to the aluminum plate having the concave portions so that the concave portions were filled with the insulating adhesive and that the thickness of an insulating layer at a portion other than the concave portions would be 60 μm. Further, a metal foil was laminated on the insulating adhesive to obtain a metal base board. With respect to the insulating adhesive, it was cured into a shape with a diameter of 10 mm and a thickness of 2 mm to prepare a test specimen for measuring the coefficient of thermal conductivity and evaluation was carried out and as a result, it was 1.5 W/mK.

Further, the capacitance per unit area between the metal plate and a circuit on the concave portion filled with the insulating adhesive was 35 pF/cm$^2$, and the capacitance per unit area between the metal plate and a circuit at a portion other than the concave portions was 120 pF/cm$^2$. The capacitance per unit area was obtained in such a manner that the capacitance at a measurement frequency of 1 Mz was obtained by an LCR meter, the area of a portion which was in contact with the insulating adhesive of a circuit at the measured portion was obtained, and the capacitance was divided by the area of the circuit.

Then, a hybrid integrated circuit having a control semiconductor to control a power semiconductor was formed on the concave portion of the metal base board, and a circuit having a power semiconductor or a control semiconductor was formed at a portion other than the concave portions, to obtain a metal base circuit board.

Then, using the metal base circuit board, a hybrid integrated circuit as shown in FIG. 4-2 was prepared. The hybrid integrated circuit is a digital amplifier having a digital signal IC as a control semiconductor and MOS-FET as a power semiconductor mounted. The hybrid integrated circuit was operated at an operating frequency of 600 kHz and as a result, normal operation was confirmed.

EXAMPLE 5-2

In the same manner as in Example 5-1 except that an epoxy resin containing 60 vol % of an aluminum filler was used as the insulating adhesive, a cured test specimen of the insulating adhesive, a metal base board and a metal base circuit board were prepared. The coefficient of thermal conductivity of the insulating adhesive was 2.8 W/mK, the capacitance per unit area between the metal plate and a circuit at the concave portion filled with the insulating adhesive was 45 pF/cm$^2$, and the capacitance per unit area between the metal plate and a circuit at the portion other than the concave portions was 140 pF/cm$^2$.

A digital amplifier was prepared in the same manner as in Example 5-1 and operated and as a result, it was confirmed that it normally operated continuously for at least 1 hour at an operating frequency of 600 kHz.

COMPARATIVE EXAMPLE 5-1

In the same manner as in Example 5-1 except that a flat aluminum plate with no concaves was used and that the insulating adhesive was applied in a thickness of 60 μm on the aluminum plate, a cured test specimen of the insulating adhesive, a metal base board and a metal base circuit board were prepared. The coefficient of thermal conductivity of the cured insulating adhesive was 1.5 W/mK, and the capacitance per unit area between a circuit and the metal plate was 123 pF/cm$^2$.

Further, a digital amplifier was prepared in the same manner as in Example 5-1 and operated. As a result, it was operated at an operating frequency of 600 kHz but malfunctioned.

COMPARATIVE EXAMPLE 5-2

In the same manner as in Example 5-1 except that a flat aluminum plate with no concaves was used and that the insulating adhesive was applied in a thickness of 260 μm on the aluminum plate, a cured test specimen of the insulating adhesive, a metal base board and a metal base circuit board were prepared. The coefficient of thermal conductivity of the cured insulating adhesive was 1.5 W/mK, and the capacitance per unit area between a circuit and the metal plate was 32 pF/cm$^2$.

Further, a digital amplifier was prepared in the same manner as in Example 5-1 and operated. As a result, it normally operated at the beginning of the operation at an operating frequency of 600 kHz, but it stopped operating after operation for fire seconds due to heat generation of a power transistor.

INDUSTRIAL APPLICABILITY

The process for producing a metal base circuit board of the present invention is characterized in that it can securely and stably provide a metal base circuit board having the above characteristics, and the process is industrially very useful.

The metal base circuit board of the present invention is characterized in that characteristics of a circuit board varies partially even on the same circuit board, and various types of semiconductor devices, etc. can be mounted on it. For example, it can suitably be used for e.g. a hybrid integrated circuit having both power semiconductor and control semiconductor. Further, a heat generating electronic component or a high frequency generating apparatus can be appropriately disposed on a desired position of the circuit board. Resultingly, such effects can also be obtained that the heat cycle resistance of a mounted electronic component such as a chip resistor improves. Therefore, it is useful as a circuit board for various hybrid integrated circuits.

The metal base circuit board of the present invention has both circuit portion which has a low capacitance and on which an electronic component such as a resistor chip or a condenser to control a power semiconductor is suitably mounted and circuit portion which has a slightly high capacitance but is excellent in thermal conductivity, and on which a control semiconductor or a power semiconductor which requires heat dissipation is suitably mounted, and it can provide a hybrid integrated circuit with high operational reliability and is industrially very useful.

According to the production process of the present invention, a metal base circuit board having both portion which has a low capacitance and on which an electronic component such as a resistor chip or a condenser to control a power semiconductor is suitably mounted and portion which has a slightly high capacitance but is excellent in thermal conductivity, and on which a control semiconductor or a power semiconductor which requires heat dissipation is suitably mounted, is obtained at a high yield. Accordingly, it can provide a metal base circuit board to be used for a hybrid integrated circuit at a low cost, and is industrially very useful.

The entire disclosures of Japanese Patent Application No. 2003-110377 filed on Apr. 15, 2003, Japanese Patent Application No. 2003-275979 filed on Jul. 17, 2003, Japanese Patent Application No. 2003-326256 filed on Sep. 18, 2003, Japanese Patent Application No. 2004-042993 filed on Feb. 19, 2004 and Japanese Patent Application No. 2004-055890 filed on Mar. 1, 2004 including specifications, claims, drawings and summaries are incorporated herein by reference in their entireties.

The invention claimed is:

1. A metal base circuit board to be used for a hybrid integrated circuit, comprising:
   a plurality of circuit pads provided on a metal plate;
   a first insulating layer in between the plurality of the circuit pads and the metal plate;
   a second insulating layer in between the plurality of the circuit pads and the metal plate and underneath the first insulating layer;
   a power semiconductor mounted on one circuit pad of the plurality of the circuit pads;
   a control semiconductor configured to control the power semiconductor, provided on another circuit pad of the plurality of the circuit pads; and
   a low capacitance portion embedded in the metal plate under the first insulating layer, the low capacitance portion embedded in the second insulating layer such that a sidewall of the low capacitance portion is vertically planar with a sidewall of the second insulating layer, and the low capacitance portion is disposed under the another circuit pad of the plurality of the circuit pads on which the control semiconductor is mounted.

2. The metal base circuit board according to claim 1, wherein the low capacitance portion is made of a resin containing an inorganic filler and has a dielectric constant of from 2 to 9.

3. The metal base circuit board according to claim 1, wherein the thickness of the low capacitance portion is from 100 to 1,000 μm.

4. The metal base circuit board of claim 1, wherein the low capacitance portion is disposed directly under the another circuit pad.

* * * * *